US008263843B2

(12) United States Patent
Kim et al.

(10) Patent No.: US 8,263,843 B2
(45) Date of Patent: Sep. 11, 2012

(54) GRAPHENE NANOPLATELET METAL MATRIX

(75) Inventors: Namsoo Paul Kim, Bellevue, WA (US); James Ping Huang, Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 333 days.

(21) Appl. No.: 12/614,215

(22) Filed: Nov. 6, 2009

(65) Prior Publication Data

US 2011/0108978 A1    May 12, 2011

(51) Int. Cl.
*H01L 23/373* (2006.01)
(52) U.S. Cl. ... 977/755; 252/503; 257/712; 257/E23.08; 438/122
(58) Field of Classification Search .................. 252/503; 257/712, E23.08; 438/122; 977/734, 755
See application file for complete search history.

(56) References Cited

U.S. PATENT DOCUMENTS

| 3,820,236 | A | * | 6/1974 | Haitz | 438/460 |
| 7,071,258 | B1 | * | 7/2006 | Jang et al. | 524/496 |
| 7,790,285 | B2 | * | 9/2010 | Zhamu et al. | 428/402 |
| 2008/0026243 | A1 | | 1/2008 | Pickard et al. | |
| 2008/0067673 | A1 | | 3/2008 | Takamatsu et al. | |
| 2010/0200839 | A1 | * | 8/2010 | Okai et al. | 257/29 |
| 2011/0042649 | A1 | * | 2/2011 | Duvall et al. | 257/27 |
| 2011/0244210 | A1 | * | 10/2011 | Choi et al. | 428/220 |

OTHER PUBLICATIONS

K. S. Novoselov, et al, Department of Physics, University of Manchester, Electric field Effect in Atomically Thin Carbon Films, Oct. 22, 2004, Science.
A. K. Geim and K. S. Novoselov, The Rise of Graphene, United Kingdom.
B. Z. Jang, A. Zhamu, Processing of nanographene platelets (NGPs) and NGP nanocomposites: a review, May 28, 2008, Dayton, Ohio, J. Material Science.
Alexander A. Balandin, et al, Superior thermal Conductivity of Single-Layer Graphene, Jan. 15, 2008, Nano Letters 2008, vol. 8, No. 3 902-907, American Chemical Society, Riverside, California.

* cited by examiner

*Primary Examiner* — Allan R Wilson
(74) *Attorney, Agent, or Firm* — McNees Wallace & Nurick LLC

(57) ABSTRACT

A metal matrix composite is disclosed that includes graphene nanoplatelets dispersed in a metal matrix. The composite provides for improved thermal conductivity. The composite may be formed into heat spreaders or other thermal management devices to provide improved cooling to electronic and electrical equipment and semiconductor devices.

20 Claims, 4 Drawing Sheets

GRAPHENE NANOPLATELET METAL MATRIX

FIELD

This disclosure relates generally to a composite materials, and more particularly to metal matrix composites including graphene nanoplatelets.

BACKGROUND

Highly conductive metals have been used to form conducting components such as heat spreaders and heat sinks for high power electronic packaging and other thermal management applications. In some applications, metal matrix composites (MMC's) formed by adding particulate fillers to a metal matrix have been used to optimize the properties of a conducting component to suit the requirements of a particular application. By properly selecting a particulate filler and a metal matrix, material properties can be controlled. For example, SiC particles have been added to an aluminum matrix to improve the coefficient of thermal expansion (CTE), stiffness, and wear resistance as compared to pure aluminum. However, in general, the thermal conductivity of Al/SiC MMC's do not meet desired expectations. Additionally, graphite and carbon nanotube MMC's have been developed. However, these MMC's can experience mechanical stress problems associated with the poor shear stress characteristics. Furthermore, carbon nanotubes are an expensive filler material.

There is a need for an improved material for conducting heat away from heat generating components such as semiconductor devices.

SUMMARY

The following embodiments and aspects thereof are described and illustrated in conjunction with systems and methods that are meant to be exemplary and illustrative, not limiting in scope. In various embodiments, one or more of the limitations described above in the Background have been reduced or eliminated, while other embodiments are directed to other improvements.

A first embodiment of the disclosure includes a composite including a metal matrix and uniformly oriented graphene.

A second embodiment of the disclosure includes a semiconductor package including a thermal management member and a semiconductor device. The thermal management member includes a metal matrix and graphene.

A third embodiment of the disclosure includes a method of forming a graphene metal matrix composite including the steps of forming a substantially uniformly oriented graphene layer, and forming the metal matrix composite by including the substantially uniformly oriented graphene layer in the metal matrix.

One advantage of the present disclosure is to provide a MMC with substantially improved thermal conductivity.

Another advantage of the present disclosure is to provide a composite having improved thermal conductivity-to-weight ratio than graphite or carbon nanotube embedded metal matrix heat spreaders.

Another advantage of the present disclosure is to provide a composite having improved mechanical stress issues as compared to MMC's with graphite.

Another advantage of the present disclosure is to provide a low cost MMC.

Another advantage of the present disclosure is to provide a novel process to produce graphene metal matrix composite thermal management components.

Yet another advantage of the present disclosure is to provide a reduced weight thermal management system.

Further aspects of the method and apparatus are disclosed herein. Other features and advantages of the present disclosure will be apparent from the following more detailed description of the preferred embodiment, taken in conjunction with the accompanying drawings that illustrate, by way of example, the principles of the disclosure.

DETAILED DESCRIPTION

The present disclosure now will be described more fully hereinafter with reference to the accompanying drawing, in which a preferred embodiment of the disclosure is shown. This disclosure may, however, be embodied in many different forms and should not be construed as limited to the embodiments set forth herein; rather, these embodiments are provided so that this disclosure will be thorough and complete and will fully convey the scope of the disclosure to those skilled in the art. All composition percents are volume percent, unless otherwise specified.

According to the present disclosure, a MMC is disclosed that includes a metal matrix and graphene nanoplatelets. The metal matrix may be a highly conductive metal or metal alloy. In one embodiment, the metal matrix may be selected from a group including copper, aluminum and alloys, thereof.

Graphene is a one-atom-thick planar sheet of $sp^2$-bonded carbon atoms that are densely packed in a honeycomb crystal lattice. Graphene has a density of approximately 1.7 $g/cm^3$. Graphene nanosheets or nanoplatelets are formed from layers of graphene.

Figure 1:
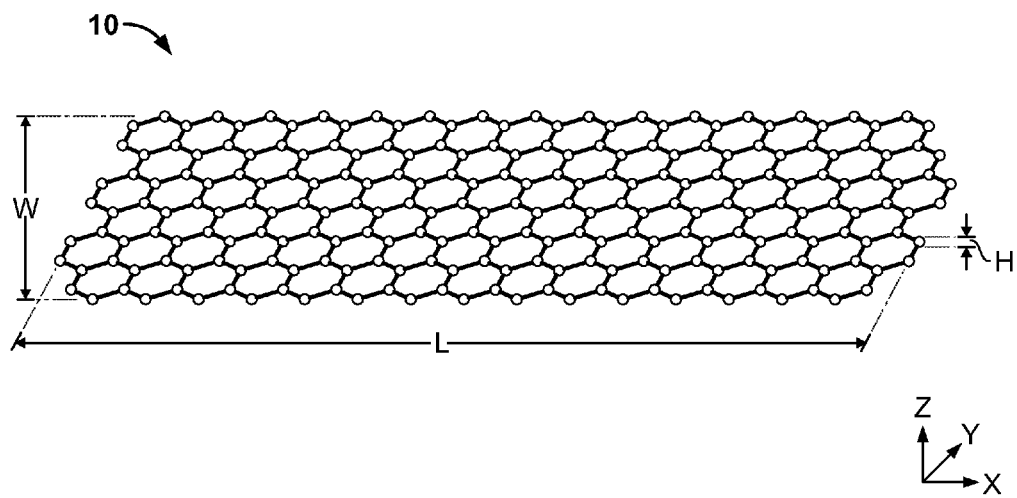
FIG. 1 illustrates an exemplary graphene nanoplatelet according to the disclosure.

FIG. 1 illustrates a graphene nanoplatelet 10 according to an embodiment of the present disclosure. As can be seen in FIG. 1, the graphene nanoplatelet 10 has a length (L) along the X axis, a width (W) along the Y axis, and a height (H) along the Z axis. In other words, the L and W lie in the X,Y plane. The L and W are the major dimensions of the graphene nanoplatelet 10, or in other words, the graphene nanoplatelet is oriented in the X,Y plane. In one embodiment, the L and W may be about 50 nanometers (nm) to about 20 mm (millimeters). In yet another embodiment, the L and W may be about 200 nm to about 5 microns (μm). In yet another embodiment, the L and W may be about 300 nm to about 2 μm. In yet another embodiment, the L and W may be about 1 mm to about 20 mm. Graphene nanoplatelets 10 have a thermal conductivity of about 5,300 watts/(meter×degree Kelvin) (W/mK) in the X-Y plane.

In this exemplary embodiment, the graphene nanoplatelet 10 has a rectangular geometry in the X,Y plane. In another embodiment, the nanoplatelet 10 may have other geometries in the X,Y plane, including, but not limited to square, oval, and hexagonal. The present disclosure proposes that larger X,Y planar dimensions are desirable, and as nanoplatelet formation technology develops, larger platelet sizes are contemplated and considered within the scope of this disclosure.

In one embodiment, the graphene nanoplatelets 10 have an average H in the Z direction of less than about 10 nanometers (nm). In another embodiment, the graphene nanoplatelets 10 have an average H of less than about 5 nm. In still another embodiment, the graphene nanoplatelets 10 have an average H of less than about 2 nm. In another embodiment, the graphene nanoplatelets 10 have an average H of less than about 1 nm. In yet another embodiment, the graphene nanoplatelets 10 have an average H of less than about 0.5 nm.

In another embodiment, the graphene nanoplatelets 10 have an average H of about three atomic layers. In another embodiment, the graphene nanoplatelets 10 have an average H of about 2 atomic layers. In yet another embodiment, the graphene nanoplatelets 10 have an average H of about 1 atomic layer.

Figure 2:
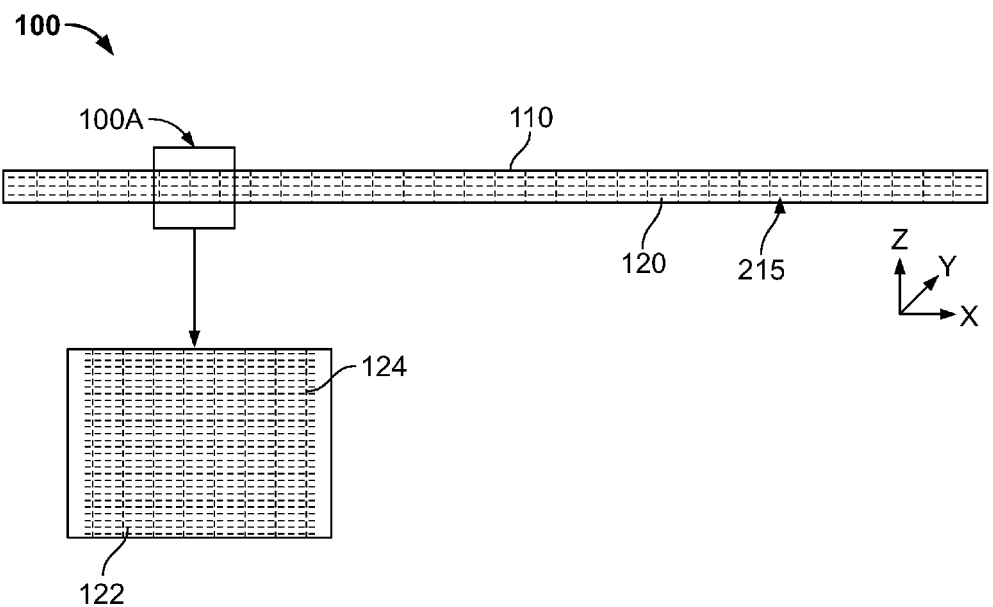
FIG. 2 is an exemplary embodiment of a metal matrix composite according to the disclosure.

FIG. 2 illustrates an exemplary graphene metal matrix composite (composite) 100 according to the disclosure. In this exemplary embodiment, the composite 100 has a plate or sheet geometry. The composite 100 includes a metal matrix 110 and graphene nanoplatelets 120. The graphene nanoplatelets 120 are substantially uniformly oriented in the X-Y plane in layered grids or sheets 125 that are substantially uniformly distributed in the metal matrix 110. The graphene 125 is uniformly oriented in the metal matrix 100. The metal matrix 110 may be a highly conductive metal or metal alloy. In one embodiment, the metal matrix 100 is selected from the group including copper, aluminum, copper alloys, and aluminum alloys.

In one embodiment, the composite 100 includes graphene nanoplatelets 120 in an amount of about 2 volume percent (vol %) to about 90 vol %. In another embodiment, the composite 100 includes graphene nanoplatelets 120 in an amount of about 5 vol % to about 60 vol %. In still another embodiment, the composite 100 includes graphene nanoplatelets 120 in an amount of about 5 vol % to about 30 vol %. In yet another embodiment, the composite 100 includes graphene nanoplatelets 120 in an amount of about 5 vol % to about 10 vol %. In still another embodiment, the composite 100 includes graphene nanoplatelets 120 in an amount of about 10 vol %.

An expanded view of the composite 100 is shown in 100A. As can be seen in 100A, the grid sheets 125 include horizontal grids 122 and vertical grids 124. The horizontal grids 122 enhance thermal conductivity in the X,Y plane or X,Y directions. The vertical grids 124 enhance thermal conductivity in the Z direction. The horizontal grids 122 have the major nanoplatelet dimension or axis in the X,Y plane and thickness in the Z direction. The vertical grids 124 have the major nanoplatelet dimension in the Z direction and thickness in the X,Y plane. The horizontal grids 122 and the vertical grids 124 substantially orient the graphene nanoplatelets 120 in two perpendicularly oriented directions. When the ratio of horizontal grids 122 to vertical grids 124 is high, as shown in FIG. 2, the graphene nanoplatelets 120 provide for increased heat transfer in the X direction compared to the matrix metal. For example, the ratio of horizontal grids 122 to vertical grids 124 may be more than about 90%. In another embodiment, the graphene nanoplatelets 120 includes only horizontal grids 122.

According to the present disclosure, graphene nanoplatelets (with a thermal conductivity of about 5,300 (W/mK) in the X-Y plane) are uniformly distributed in a metal matrix, such as, but not limited to copper (with a thermal conductivity of 400 W/mK) or aluminum (with a thermal conductivity of 273 W/mK) to increase thermal conductivity over the matrix metal in the orientation plane of the graphene nanoplatelets while reducing its weight. Thus, the disclosure produces a composite having an increased thermal conductivity-to-weight ratio than the matrix metal. In one embodiment, an about 10 vol % graphene Al composite has a thermal conductivity of about 713 W/mK. In another embodiment, an about 10 vol % graphene Cu composite has a thermal conductivity of about 860 W/mK.

A graphene metal matrix composite can be manufactured according to any of the following exemplary processes. The graphene nanoplatelets are provided in dry form or in dispersed form in solvents. The graphene nanoplatelets, if not provided in a solvent, are dispersed in a solvent with a low evaporation temperature such as acetone or alcohol.

The graphene nanoplatelets in solvent are poured over a thin mesh. The graphene nanoplatelets are captured on the mesh in a planar direction. The carrier solvent is completely removed by heating to form a graphene layer. The mesh may be a metal or polymer. In one embodiment, the mesh is the same metal as the matrix metal. In this case, the mesh will not be removed for further processing. In another embodiment, the mesh may be formed of a removable material, such as a polymer or organic material. In this embodiment, the mesh is removed, such as by heating or solvent extraction, before or during further processing to form a graphene layer.

The graphene layer is filtrated by a suitable method, such as electrolytic/electro-less plating, evaporation, or sputtering, to form a thin layer of metal-graphene composite. In one embodiment, the metal is aluminum or copper. By repeating the steps, multiple layers are made and formed into a composite building block. Layer stacking of building blocks is performed next to form a composite block having a targeted thickness. In one embodiment, a composite block including both horizontal and vertical layers may be formed by stacking building blocks to provide for both orientations of the graphene nanoplatelets.

The composite block is subsequently hot and/or cold worked to reach a final thickness and density. In one embodiment, the composite block is hot pressed, formed and cold rolled to reach the final thickness. Shaping may then be performed to achieve a desired shape. For example, sawing and machining may be performed to manufacture a plate having a desired shape and size.

According to another exemplary process, the graphene composite can be formed by hot melting and extrusion of a graphene/metal mix. In this case, the alignment of graphene nanoplatelets is primarily achieved through mechanical force flow.

According to yet another exemplary process, a graphene composite is formed by forming graphene layers in a loosely connected thin sheet form by attaching graphene to the surface of sacrificial material which can be removable easily either by heating or chemicals, then infiltrating the loosely connected thin sheet form with a metal matrix by hot melt or electrolytic/electrolysis plating to form a composite building block. The composite building blocks are subsequently processed as described above, for example including the steps of stacking, hot pressing, cold forming and machining. In yet another embodiment, a graphene composite was formed using graphene sheets and conventional powder metallurgical processing.

Figure 3:
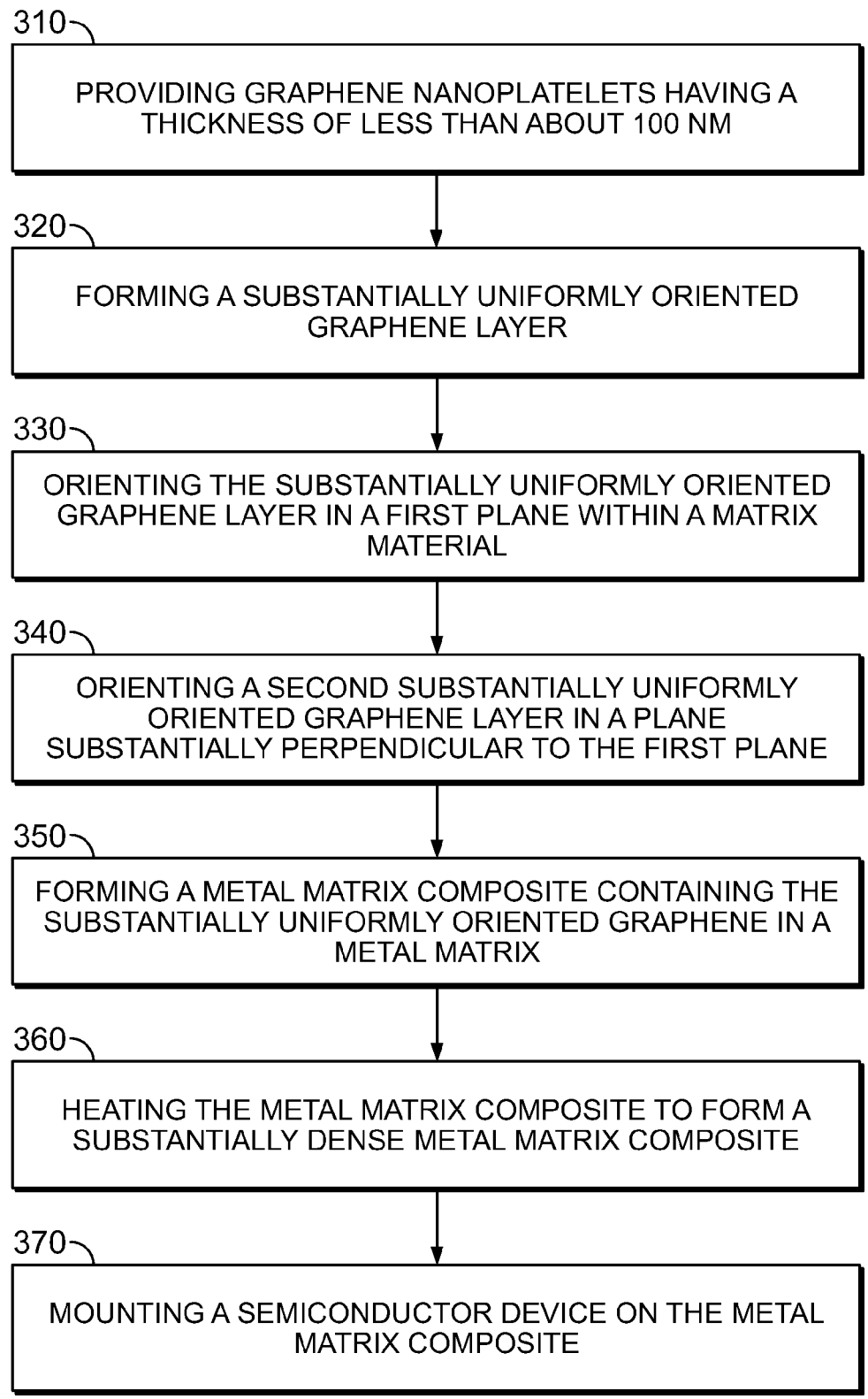
FIG. 3 illustrates a exemplary process for forming a graphene metal matrix composite according to the disclosure.

FIG. 3 illustrates a exemplary process for forming a graphene metal matrix composite including the steps of providing graphene nanoplatelets having a thickness of less than about 100 nm 310; forming a substantially uniformly oriented graphene layer 320; orienting the substantially uniformly oriented graphene layer in a first plane with a matrix material 330; orienting a second substantially uniformly oriented graphene layer in a plane substantially perpendicular to the first plane 340; forming a metal matrix composite containing the substantially uniformly oriented graphene in a metal matrix 350; heating the metal matrix composite to form a substantially dense metal matrix composite 360; and mounting a semiconductor device on the metal matrix composite 370. In one embodiment, the metal matrix is aluminum or copper.

In any of the above processes, a small amount of impurities, for example for alloying purpose, can be added at the hot melt stage or any subsequent step for cost effective manufacturing. All of these manufacturing techniques are amenable to and are expected to be automated, for example in a roll-to-roll conveyor system. The roll-to-roll manufacturing process is typically cheaper than conventional batch mode processing.

Figure 4:
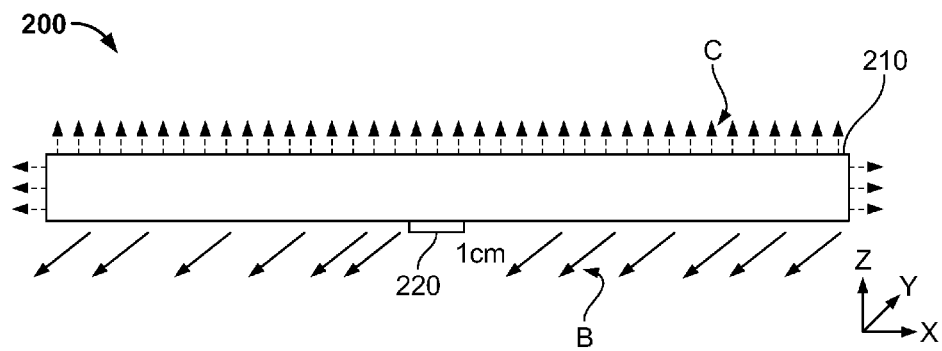
FIG. 4 is an exemplary embodiment of a semiconductor package simplified for relative comparison according to the disclosure.

FIG. 4 illustrates an exemplary semiconductor package 200 including a thermal management member 210 and a semiconductor device 220 mounted at the center of the thermal management member 210 according to the disclosure. The thermal management member 210 is a thermal management plate. In other embodiments, the thermal management member may be selected from a group including, but not limited to avionics chassis, heat spreaders, equipment enclosures, cold plates, rack, trays, shelf, heat sinks, heat exchanger, radiators, and heat pipes. The semiconductor device is a semiconductor chip. In other embodiments, the semiconductor device may be any heat generating semiconductor component, such as, but not limited to microprocessor, power inverter/converter, solid state switch, Application Specific Integrated Circuit (ASIC), graphics accelerator chip, and Insulated Gate Bipolar Transistor (IGBT).

Figure 5:
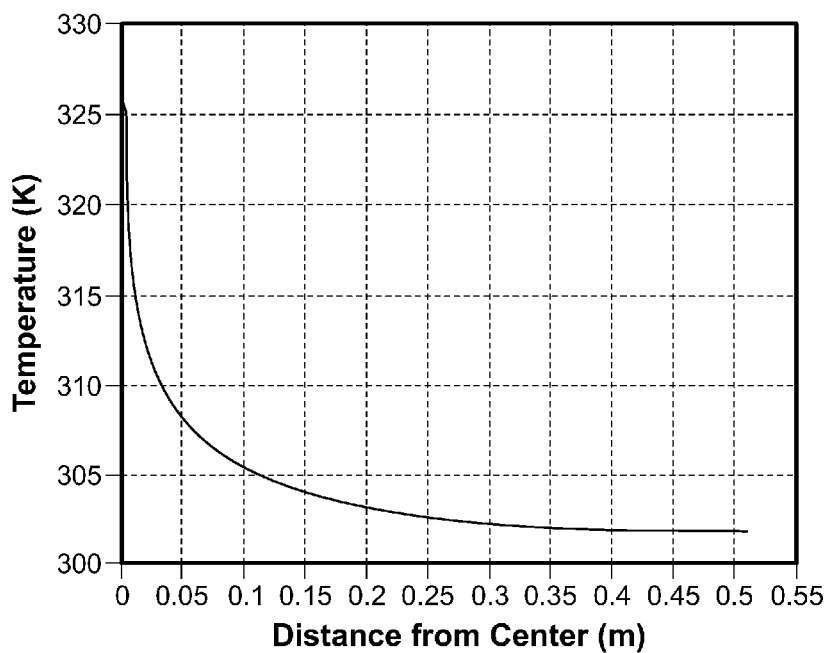
FIG. 5 illustrates a thermal analysis result for an exemplary graphene/aluminum matrix.

In one example, simulations were performed using a thermal management member 210 having a width (W) in the Y direction of 76 cm, a length (L) in the X direction of 76 cm, and a thickness or height (H) in the Z direction of 0.5 cm, and a semiconductor chip 220 having a 100 W power output and having a width (w) in the X direction of 1 cm and a length (l) in the X direction of 1 cm. For these simulations, runs were performed for a thermal management member 210 formed of aluminum, copper, aluminum and 10 vol % graphene, and aluminum and 10 vol % graphite. In these simulations, the graphene platelets were horizontally oriented, or in other words, oriented with maximum dimensions in the X-Y plane, thickness of the platelets in the Z direction. For these simulations, forced air cooling was provided at a rate of 60 W/m$^2$K as indicted by the diagonal arrows B and ambient air convection was provided at a rate of 6 W/m$^2$K as indicated by the vertical and horizontal arrows C. FIG. 5 shows the results of the simulation for aluminum and 10 vol % graphene.

Figure 6:
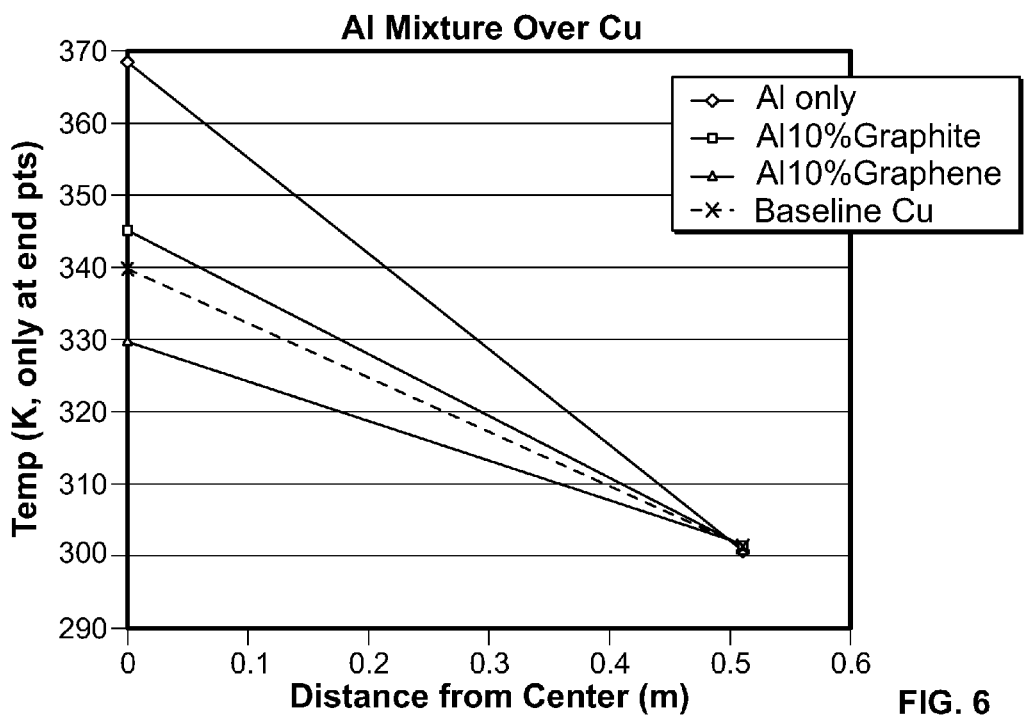
FIG. 6 illustrates comparative thermal analysis results for a semiconductor package.

FIG. 6 shows the comparative results of the simulation for the materials chosen. In FIG. 6, straight line plots of from the center point to the edge point are shown for simplicity. As can be seen in FIG. 6, the aluminum and 10 vol. % graphene composite outperformed the other materials by maintaining the lowest temperature at the center of the thermal management member 210 member. This reflects the increased thermal conductivity of aluminum and 10 vol % graphene thermal management member compared to the other materials.

Figure 7:
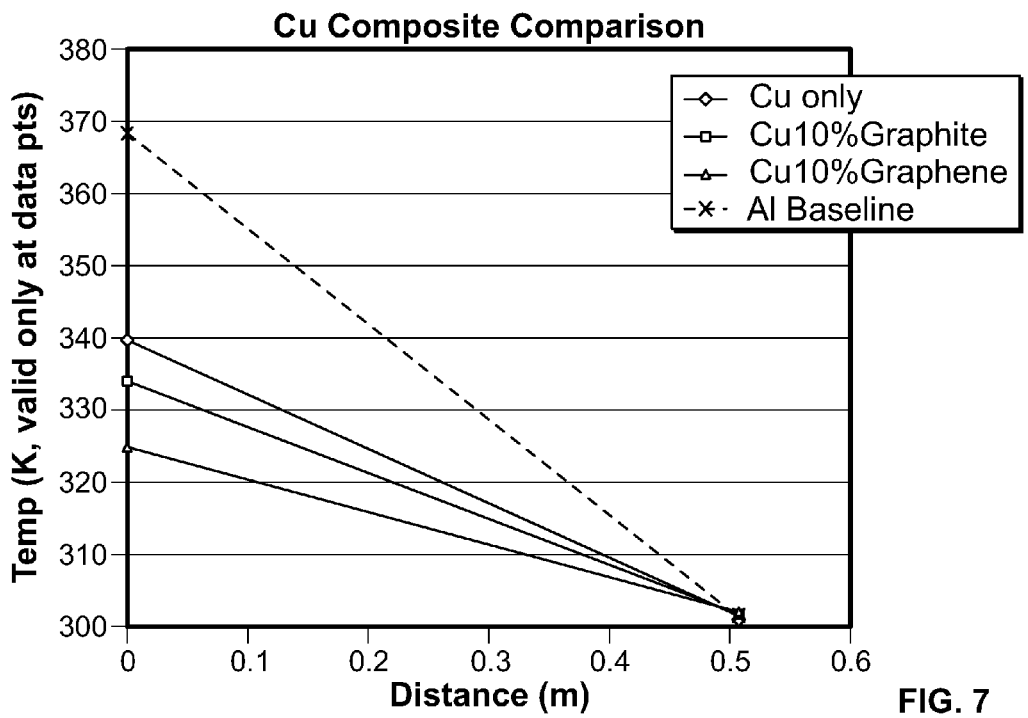
FIG. 7 illustrates other comparative thermal analysis results for a semiconductor package.

FIG. 7 shows the results of the simulation for aluminum, copper, copper and 10 vol % graphene, and copper and 10 vol % graphite, again shown as straight line plots for simplicity. As can be seen in FIG. 7, the copper and 10 vol % graphene outperformed the other composites by maintaining the lowest temperature at the center of the thermal management plate and by most rapidly decreasing the temperature away from the center. This reflects the increased thermal conductivity of copper and 10 vol % graphene thermal management plate compared to the other materials.

The above compositions and processes may be used to form various heat transfer components, such as, but not limited to include avionics chassis, heat spreaders, equipment enclosures, cold plates, rack, trays, shelf, heat sinks, heat exchanger, radiators, and heat pipes. In these various structures, the nanoplatelets are oriented to promote heat transfer in a particular direction based on the structure orientation and use.

While the disclosure has been described with reference to exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiments disclosed as the best mode contemplated for carrying out this disclosure, but that the disclosure will include all embodiments falling within the scope of the appended claims. It is therefore intended that the following appended claims and claims hereafter introduced are interpreted to include all such modifications, permutations, additions, and sub-combinations as are within their true spirit and scope.

The invention claimed is:

1. A composite, comprising:
   a highly thermally conductive metal matrix;
   graphene nanoplatelets having a thickness of less than about 1 nanometer;
   wherein the graphene nanoplatelets are substantially uniformly oriented in a direction in the metal matrix.

2. The composite of claim 1, wherein the metal matrix is selected from a group comprising copper and aluminum.

3. The composite of claim 1, wherein the composite comprises between about 2 vol % and about 90 vol % graphene.

4. The composite of claim 1, wherein the composite comprises between about 5 vol % and about 20 vol % graphene nanoplatelets.

5. The composite of claim 1 wherein the graphene nanoplatelets have a thickness of one atomic layer.

6. The composite of claim 5 wherein the graphene nanoplatelets have a thermal conductivity of about 5300 W/mK.

7. The composite of claim 1 wherein the graphene nanoplatelets have a thickness of two atomic layers and a thermal conductivity of about 5300 W/mK.

8. The composite of claim 1 wherein the graphene nanoplatelets have a thickness of three atomic layers and a thermal conductivity of about 5300 W/mK.

9. The composite of claim 1 wherein the thermal conductivity of the composite in a direction parallel to the plane of the graphene nanoplatelets is higher than the thermal conductivity of the highly conductive metal matrix in the direction parallel to the plane of the graphene nanoplatelets.

10. The composite of claim 2 wherein the highly conductive metal matrix includes aluminum, the thermal conductivity of the composite in the plane of the graphene nanoplatelets is about 713 W/mK, and the thermal conductivity-to-weight ratio of the composite is greater than the thermal conductivity-to-weight ratio of aluminum.

11. The composite of claim 2 wherein the highly conductive metal matrix includes copper, the thermal conductivity of the composite in the plane of the graphene nanoplatelets is about 860 W/mK, and the thermal conductivity-to-weight ratio of the composite is greater than the thermal conductivity of copper.

12. A semiconductor package, comprising:
a thermal management member, and
a semiconductor device;
wherein the thermal management member further comprises:
a highly thermally conductive metal matrix; and
graphene nanoplatelets having a thickness of less than about 1 nanometer;
wherein the graphene nanoplatelets are substantially uniformly oriented in a direction in the metal matrix.

13. The package of claim 12, wherein the graphene comprises graphene nanoplatelets having a thickness of 1-3 atomic layers.

14. The package of claim 12, wherein the metal matrix is selected from a group comprising copper and aluminum.

15. The package of claim 12, wherein the composite comprises between about 2 vol % and about 90 vol % graphene nanoplatelets.

16. The package of claim 12, wherein the thermal management member has a plate geometry.

17. The package of claim 12, wherein the thermal management member is selected from the group consisting of avionics chassis, heat spreaders, equipment enclosures, cold plates, rack, trays, shelf, heat sinks, heat exchanger, radiators, and heat pipes.

18. The semiconductor package of claim 14 wherein the thermal management layer further includes:
a first graphene layer formed from layers of graphene nanoplatelets, wherein the graphene nanoplatelets lie in a plane that is substantially uniformly horizontally oriented in the highly thermally conductive metal matrix; and
wherein the thermal conductivity of the thermal management member in a direction parallel to the plane of the graphene nanoplatelets is higher than the thermal conductivity of the highly conductive metal matrix in the direction parallel to the plane of the graphene nanoplatelets.

19. The semiconductor package of claim 14 wherein the thermal management member includes aluminum as the highly conductive metal matrix and the thermal conductivity of the thermal management member in the plane of the graphene layer is about 713 W/mK and the thermal conductivity-to-weight ratio of the composite is greater than the thermal conductivity-to weight ratio of aluminum.

20. The semiconductor package of claim 14 wherein the thermal management member includes copper as the highly conductive metal matrix and the thermal conductivity of the thermal management member in the plane of the graphene layer is about 860 W/mK and the thermal conductivity-to-weight ratio of the composite is greater than the thermal conductivity-to-weight ratio of copper.

* * * * *